United States Patent
Haggerty

(10) Patent No.: US 10,424,834 B2
(45) Date of Patent: Sep. 24, 2019

(54) DEVICES, SYSTEMS, AND METHODS RELATED TO REPROGRAMMING A REMOTE ANTENNA UNIT VIA A COMMUNICATION CABLE

(71) Applicant: Laird Technologies, Inc., Earth City, MO (US)

(72) Inventor: Michael Haggerty, Grand Blanc, MI (US)

(*) Notice: Subject to any disclaimer, the term of this patent is extended or adjusted under 35 U.S.C. 154(b) by 0 days.

(21) Appl. No.: 15/842,348

(22) Filed: Dec. 14, 2017

(65) Prior Publication Data

US 2019/0123434 A1 Apr. 25, 2019

Related U.S. Application Data

(60) Provisional application No. 62/576,884, filed on Oct. 25, 2017.

(51) Int. Cl.
*H01Q 1/32* (2006.01)
*H03G 3/30* (2006.01)
(Continued)

(52) U.S. Cl.
CPC ......... *H01Q 1/3275* (2013.01); *H03G 3/3042* (2013.01); *H04W 52/18* (2013.01); *G05B 19/0423* (2013.01); *G05B 2219/15117* (2013.01); *G05B 2219/25196* (2013.01); *H04W 88/085* (2013.01)

(58) Field of Classification Search
CPC .................................................. H01Q 1/3275
See application file for complete search history.

(56) References Cited

U.S. PATENT DOCUMENTS 9,191,903 B2 11/2015 Sasson
10,038,508 B1* 7/2018 Kerselaers ............. H04B 17/23
(Continued)

FOREIGN PATENT DOCUMENTS

DE 102009019817 A1 12/2009

OTHER PUBLICATIONS

European Search Report for EP Application No. 1820715.2 filed Dec. 22, 2018 which claims priority to the instant application, dated Feb. 2, 2019, 7 pages.

*Primary Examiner* — Kevin M Cunningham
(74) *Attorney, Agent, or Firm* — Harness, Dickey & Pierce, P.L.C.; Anthony G. Fussner

(57) ABSTRACT

According to various aspects, exemplary embodiments are disclosed of devices, systems, and methods related to reprogramming a vehicular antenna unit via a communication cable. In an exemplary embodiment, a vehicular communication system includes a radio control unit, and a remote antenna unit including at least one amplifier, a controller, and at least one of an antenna and an antenna interface. A cable is coupled between the radio control unit and the remote antenna unit. The radio control unit is configured to transmit radio frequency (RF) communication signals to the remote antenna unit through the cable, and the remote antenna unit is configured to transmit RF communication signals to the radio control unit through the cable. The radio control unit is configured to transmit flash programming data to the remote antenna unit through the cable to reprogram the controller of the remote antenna unit.

15 Claims, 3 Drawing Sheets

(51) Int. Cl.
*H04W 52/18* (2009.01)
*H04W 88/08* (2009.01)
*G05B 19/042* (2006.01)

(56) References Cited

U.S. PATENT DOCUMENTS

2006/0190528 A1* 8/2006 Pugel .................. H04L 12/2801
                                                     709/203
2014/0006677 A1* 1/2014 Iyer .................... G06F 13/4291
                                                     710/316
2015/0375695 A1* 12/2015 Grimm .............. G05B 19/0428
                                                     701/1
2017/0047962 A1   2/2017 Gururaj et al.
2017/0244157 A1* 8/2017 Muehlbauer ........... H01Q 21/22

* cited by examiner

DEVICES, SYSTEMS, AND METHODS RELATED TO REPROGRAMMING A REMOTE ANTENNA UNIT VIA A COMMUNICATION CABLE

CROSS-REFERENCE TO RELATED APPLICATION

This application claims the benefit and priority of U.S. Provisional Patent Application No. 62/576,884 filed Oct. 25, 2017. The entire disclosure of the above application is incorporated herein by reference.

FIELD

The present disclosure generally relates to devices, systems, and methods related to reprogramming a remote antenna unit via a communication cable.

BACKGROUND

This section provides background information related to the present disclosure which is not necessarily prior art.

Some vehicular communication systems include one or more radio control units and one or more remote antenna units that are linked by a cable. The radio control unit sends radio frequency (RF) communication signals through the cable to the remote antenna unit, where the RF communications signals can be amplified before they are applied to an antenna. Similarly, received RF communication signals can be amplified by the remote antenna unit before transmission from the remote antenna unit to the radio control unit. In some applications, it is desirable that the amplification be controlled by the remote antenna unit to, e.g., compensate for signal losses in the cable that connects the remote antenna unit and the radio control unit, etc.

Changes in the configuration of the remote antenna unit are not dealt with efficiently in the prior art. As an example, if it becomes necessary for the remote antenna unit to support a new frequency band, the remote antenna unit may be unmounted from the vehicle and replaced by a new remote antenna unit. As another option, changes may be made to the unmounted remote antenna unit, which must then be re-mounted to the vehicle. Overall, these are rather complex exercises.

DRAWINGS

The drawings described herein are for illustrative purposes only of selected embodiments and not all possible implementations, and are not intended to limit the scope of the present disclosure.

SUMMARY

Figure 1:
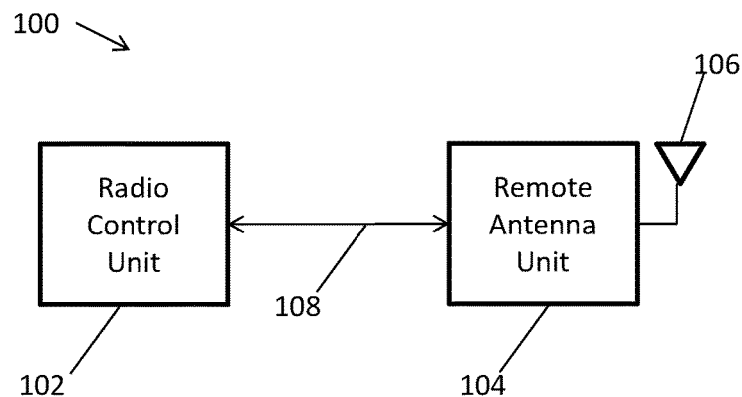
FIG. 1 is a block diagram of an example vehicular communication system for reprogramming a remote antenna unit via a communication cable, according to an example embodiment of the present disclosure.

This section provides a general summary of the disclosure, and is not a comprehensive disclosure of its full scope or all of its features.

Example embodiments described herein aim to facilitate changes to the configuration of a remote antenna unit. The system, method and remote antenna unit defined in the independent claims solves the technical problems described herein to facilitate the remote antenna unit configuration changes. It is suggested to reprogram the remote antenna unit as necessary via a remote control unit to which the remote antenna unit is connected. Further, by utilizing a same cable through which radio frequency (RF) communication signals are passed between the remote control unit and the remote antenna unit, no additional hardware may be necessary to transmit the reprogramming data.

Further areas of applicability will become apparent from the description provided herein. The description and specific examples in this summary are intended for purposes of illustration only and are not intended to limit the scope of the present disclosure.

DETAILED DESCRIPTION

Example embodiments will now be described more fully with reference to the accompanying drawings.

The inventor has recognized that typically, remote antenna units may not be reprogrammed except by disassembling the component in order to connect a programming interface, and that it is desirable that the embedded software of a controller (e.g., processor) of the remote antenna unit is capable of being reprogrammed without disassembly of a vehicle and/or the remote antenna unit itself.

Therefore, the inventor has recognized that it would be desirable to allow for software reprogramming of the remote antenna unit by utilizing the same cable through which RF communication signals are passed, thus improving the field repair capability of the remote antenna unit as well as reducing the need to potentially provide additional remote antenna unit wiring for the purpose of reprogramming the remote antenna unit. For example, reprogramming may be necessary to support a new frequency band, to improve attenuation control, to improve an operating system, etc.

For example, in a vehicular communication system architecture including one or more radio control units and one or more remote antenna units linked by one or more cables of some length, a radio control unit sends radio frequency (RF) communication signals through the cable to the remote antenna unit, where the RF communication signals can be amplified before the signals are applied to an antenna of the remote antenna unit. Similarly, received RF communication signals can be amplified by the remote antenna unit before transmission of the received RF communication signals from the remote antenna unit to the radio control unit.

The system may include vehicle-to-everything (V2X) communication, and may operate at about 5.9 GHz with RF switching between transmit (Tx) and receive (Rx) paths and active cable loss compensation. For example, in some applications it is desirable that this amplification be controlled by the remote antenna unit to compensate for signal losses in the cable that connects the remote antenna unit to the radio control unit.

The inventor has recognized that example embodiments described herein allow for reprogramming of units after vehicle production has been completed, by transmitting reprogramming data through the radio control unit upstream from the remote antenna unit, thus reducing risk of obsolescence and the significant labor cost of replacement. Described herein are multiple example embodiments that provide reprogramming of remote antenna units through a cable that is shared with the RF communication channel between the remote antenna unit and the radio control unit.

In one example embodiment, flash programming data (e.g., flash programming information, an executable data file, etc.) can be multiplexed on the same cable that is used for RF communication via a pre-determined protocol, which is stored in the remote antenna unit. This protocol may be either unidirectional (e.g., communication passing only from the radio control unit to the remote antenna unit), or bidirectional (e.g., communication flowing between both elements).

Under unidirectional communication, the remote antenna unit may simply receive the reprogramming request and data payload without providing an indication to the radio control unit that the data was received and the write was completed without error. Under bidirectional communication, the antenna unit could send a confirmation, affirmative response, etc. to the radio control unit when the reprogramming action is complete. In some embodiments, bidirectional communication is the preferred protocol.

When the remote antenna unit receives an expected initialization command via this pre-determined protocol, the remote antenna unit can enter a self-programming mode and, utilizing the flash programming data provided by the radio control unit, begin overwriting a program file of the remote antenna unit. Therefore, reprogramming of the remote antenna unit can be accomplished without requiring disassembly of the remote antenna unit and/or a vehicle to which the remote antenna unit is coupled.

The initialization command could be a specific bit pattern which, when detected by the remote antenna unit, notifies the remote antenna unit that the following messages, data payload, etc. include a programming flash file. For example, the programming flash file may be an executable program file intended to be written to a controller or a non-volatile memory of a processor of the remote antenna unit. This may be a cost-effective solution, as it may not require dedicated filtering elements in the radio control unit and remote antenna unit.

Alternatively, or in addition, a dedicated subcarrier frequency on the shared cable could be used, which would provide a dedicated channel for reprogramming. The application layer of software of the remote antenna unit software would be the primary target of this method, with the reprogramming handled by boot code or low-level boot software which, when completed, initiates a reset of the remote antenna unit to begin execution of the new flash file contents (e.g., the new flash programming data).

The radio control unit may receive the flash programming data via a hard-wired interface connection, such as an assembly line diagnostic link (ALDL) port on a vehicle, an on-board diagnostics (OBD-2) port on a vehicle, etc. Alternatively, or in addition, the radio control unit may receive the flash programming data wirelessly, such as through an over-the-air (OTA) update, etc.

Disclosed herein are exemplary embodiments of devices, systems, and methods related to reprogramming a vehicular antenna unit via a communication cable. In an exemplary embodiment, a vehicular communication system includes a radio control unit and a remote antenna unit including at least one antenna, at least one amplifier, and a controller. A cable is coupled between the radio control unit and the remote antenna unit.

The radio control unit is configured to transmit radio frequency (RF) communication signals to the remote antenna unit through the cable, and the remote antenna unit is configured to transmit RF communication signals to the radio control unit through the cable. The remote antenna unit controller is configured to control a level of amplification of the at least one amplifier to compensate for signal loss in the cable during transmission of the RF communication signals, and the radio control unit is configured to transmit flash programming data to the remote antenna unit through the cable to reprogram the controller of the remote antenna unit.

In some embodiments, the remote antenna unit may be configured to reprogram the controller of the remote antenna unit based on the flash programming data received through the cable, without disassembly of the remote antenna unit, and without disassembly of a vehicle to which the remote antenna unit is coupled, to connect a programming interface to the remote antenna unit. For example, the remote antenna unit may not include any wiring dedicated to connecting a programming interface to the remote antenna unit in order to reprogram the remote antenna unit.

The remote antenna unit may be configured to receive the RF communication signals transmitted by the radio control unit via the cable, amplify the received RF communication signals using at least one amplifier, and transmit the amplified RF communication signals using the at least one antenna.

Additionally, or alternatively, the remote antenna unit may be configured to receive RF communication signals from a remote source via the at least one antenna, amplify the received RF communication signals using at least one amplifier, and transmit the amplified RF communication signals to the radio control unit via the cable.

The radio control unit and the remote antenna unit may be coupled separately to a vehicle. For example, the radio control unit and remote antenna unit may provide communication between a mobile phone located in the vehicle and a cellular base station, may provide vehicle-to-everything (V2X) communication, etc. In some embodiments, the radio control unit and remote antenna unit may transmit RF communication signals at a frequency of about 5.9 GHz within the 5.9 GHz band, or any other suitable cellular or non-cellular wireless signal operating frequency.

As described above, the flash programming data can be transmitted on the cable with the RF communication signals via a predetermined protocol stored in the remote antenna unit. For example, the predetermined protocol could include a specified bit pattern indicative that the subsequent transmitted message comprises the flash programming data.

Alternatively, or in addition, the predetermined protocol could include transmitting the flash programming data on a dedicated subcarrier frequency on the shared cable. The predetermined protocol may include multiplexing the flash programming data on the cable with the RF communication signals.

As described above, the predetermined protocol can be unidirectional such that flash programming data communications pass only from the radio control unit to the remote antenna unit. Alternatively, the predetermined protocol can be bidirectional such that flash programming data communications are transmitted in both directions between the radio control unit and the remote antenna unit.

When the remote antenna unit receives an initialization command of the predetermined protocol, the remote antenna unit may enter a self-programming mode and overwrite a program file of the remote antenna unit controller using the flash programming data transmitted by the radio control unit through the cable.

The radio control unit can receive the flash programming data using any suitable interface. For example, the radio control unit may include a hard-wired connection interface to receive the flash programming data from an on-board diagnostics port of a vehicle to which the radio control unit is coupled. Alternatively, or in addition, the radio control unit includes a wireless interface to receive the flash programming data via a wireless over-the-air (OTA) update.

With reference to the figures, FIG. 1 illustrates an example vehicular communication system 100 according to some aspects of the present disclosure. The system 100 includes a radio control unit 102 and a remote antenna unit 104. The radio control unit 102 is coupled to the remote antenna unit 104 via a cable 108 (e.g., a communication cable, etc.).

Figures 2, 3:
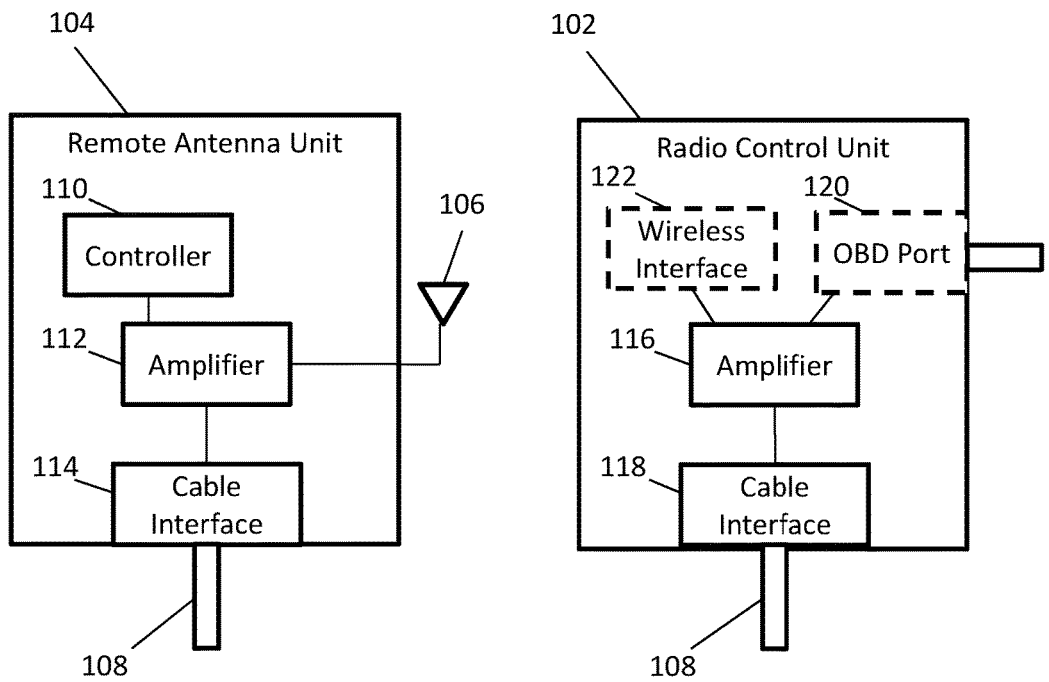
FIG. 2 is a block diagram of the remote antenna unit shown in FIG. 1.
FIG. 3 is a block diagram of the radio control unit shown in FIG. 1.

As shown in FIGS. 1 and 2, the remote antenna unit 104 includes an antenna 106, a controller 110, and an amplifier 112. The radio control unit 102 is configured to transmit radio frequency (RF) communication signals to the remote antenna unit 104 through the cable 108, and the remote antenna unit 104 is configured to transmit RF communication signals to the radio control unit 102 through the cable 108.

The remote antenna unit controller 110 is configured to control a level of amplification of the amplifier 112 to compensate for signal loss in the cable 108 during transmission of the RF communication signals. The radio control unit 102 is configured to transmit flash programming data to the remote antenna unit 104 through the cable 108 to reprogram the controller 110 of the remote antenna unit 104.

Transmitting the flash programming data from the radio control unit 102 to the remote antenna unit 104 through the cable 108 allows for reprogramming of the controller 110 of the remote antenna unit 104 based on the flash programming data received through the cable 108, without disassembly of the remote antenna unit 104 and without disassembly of a vehicle to which the remote antenna unit 104 is coupled.

For example, the remote antenna unit 104 may not include any wiring (e.g., connection interfaces, ports, etc.) dedicated to connecting a programming interface to the remote antenna unit 104 in order to reprogram the remote antenna unit 104. This allows for reprogramming of the remote antenna unit 104 in a more cost-effective manner, because labor, replacement parts, etc. associated with disassembly of the remote antenna unit 104 and the vehicle can be reduced (e.g., avoided).

As shown in FIG. 2, the remote antenna unit 104 includes an antenna 106, a controller 110, an amplifier 112, and a cable interface 114 for connecting the cable 108. The remote antenna unit 104 may be any suitable remote antenna unit capable of transmitting and/or receiving RF communication signals. In other embodiments, the antenna 106 may be separate from the remote antenna unit 104, and coupled to the remote antenna unit 104 via a wire, etc. In those cases, the remote antenna unit 104 may include an interface for connection to the antenna 106.

For example, the remote antenna unit 104 may be configured to receive the RF communication signals transmitted by the radio control unit 102 via the cable 108 and cable interface 114, amplify the received RF communication signals using the amplifier 112, and transmit the amplified RF communication signals using the antenna 106.

Additionally, or alternatively, the remote antenna unit 104 may be configured to receive RF communication signals from a remote source via the at least one antenna 106, amplify the received RF communication signals using the amplifier 112, and transmit the amplified RF communication signals to the radio control unit 102 via the cable interface 114 and cable 108.

Although FIG. 2 illustrates the remote antenna unit 104 as including one antenna 106 and one amplifier 112, it should be apparent that other embodiments may include more than one antenna and/or more than one amplifier. For example, the remote antenna unit 104 could include one transmission antenna and one reception antenna, could include one transmission amplifier and one reception amplifier, etc. In the case of multiband systems, where the remote antenna is configured to transmit and/or receive signals on two or more frequency bands, each band may be provided with a separate transmission amplifier and/or reception amplifier. Alternatively, some of the frequency bands may share one or more amplifiers.

The cable 108 may be any suitable cable for transmitting RF communication signals between the radio control unit 102 and remote antenna unit 104. For example, the cable 108 may be a coaxial cable, etc. Although only one cable 108 is illustrated in FIG. 1, it should be apparent that other embodiments may include more than one cable 108 (e.g., one cable in the transmission direction and one cable in the reception direction, etc.). The cable 108 may have any suitable length. For example, the cable 108 may be less than one meter long, more than one meter long, more than two meters long, etc.

As described above, the radio control unit 102 and the remote antenna unit 104 may be coupled separately to a vehicle. For example, the radio control unit 102 and remote antenna unit 104 may provide communication between a mobile phone located in the vehicle and a cellular base station, may provide vehicle-to-everything (V2X) communication, etc. In some embodiments, the radio control unit 102 and remote antenna unit 104 may transmit RF communication signals at about 5.9 GHz, or any other suitable cellular or non-cellular wireless signal operating frequency.

The flash programming data may be transmitted on the cable 108 along with the RF communication signals using any suitable transmission protocol. For example, the flash programming data may be transmitted on the cable 108 with the RF communication signals via a predetermined (e.g., specified) protocol stored in the remote antenna unit 104.

As described above, in some embodiments the predetermined protocol includes a specified bit pattern indicative that the subsequent transmitted message comprises the flash programming data. In other embodiments, the predetermined protocol includes transmitting the flash programming data on a dedicated subcarrier frequency on the shared cable. The predetermined protocol may include multiplexing the flash programming data on the cable with the RF communication signals.

FIG. 1 illustrates the cable 108 as bidirectional (e.g., capable of transmitting signals in both directions between the radio control unit 102 and the remote antenna unit 104). In this case, the predetermined protocol may be bidirectional such that flash programming data communications are transmitted in both directions between the radio control unit 102 and the remote antenna unit 104. For example, after the flash programming data is received from the radio control unit 102 and the remote antenna unit 104 completes reprogramming, the remote antenna unit 104 may send an acknowledgement, etc. back to the radio control unit 102 to confirm successful reprogramming of the remote antenna unit 104.

In other embodiments, the cable 108 may be unidirectional and/or the predetermined protocol may be unidirectional, such that flash programming data communications pass only from the radio control unit 102 to the remote antenna unit 104. In those cases, the remote antenna unit 104 may not send any acknowledgement signals, etc. back to the radio control unit 102 in response to successful reprogramming of the remote antenna unit 104.

The transmitted flash programming data may include any suitable flash files, data, information, software, operating instructions, computer-executable code, executable files, etc. capable of reprogramming the remote antenna unit 104. For example, the flash programming data may reprogram embedded software of the remote antenna unit 104, such as an application layer of software of the remote antenna unit 104.

The reprogramming may be handled by boot code or low-level boot software which, when completed, initiates a reset of the remote antenna unit 104 (e.g., of the controller 110 of the remote antenna unit 104), to begin execution of the new flash file contents (e.g., the new flash programming data).

FIG. 3 illustrates the radio control unit 102. The radio control unit 102 can be any suitable device capable of sending and/or receiving RF communication signals to/from the remote antenna unit 104. As shown in FIG. 3, the radio control unit 102 includes an amplifier 116 and a cable interface 118 for coupling to the cable 108.

The radio control unit 102 may receive the flash programming data from a remote source via any suitable interface. For example, FIG. 3 illustrates an optional hard-wired connection interface 120 for coupling to an on-board diagnostics interface of a vehicle, such as an OBD-2 port, an assembly line diagnostic link (ALDL) port of the vehicle, etc. In these cases, the radio control unit 102 may receive the flash programming data via the hard-wired connection interface 120.

FIG. 3 also illustrates the radio control unit 102 as including an optional wireless interface 122. The wireless interface 122 may be used to wirelessly receive the flash programming data, such as through a wireless over-the-air (OTA) update. As should be apparent, other embodiments, may include both interfaces 120 and 122, only one of the interfaces 120 and 122, none of the interfaces 120 and 122, etc.

For both the remote antenna unit 104 as well as the radio control unit 102, an amplifier 112 and 116, respectively, is shown. In some embodiments, it may be desirable to use an attenuator in one or both of the remote antenna unit 104 and the radio control unit 102, in addition to the amplifiers 112 and 116. The attenuator may be placed in front of or after the amplifiers 112 and 116, in the direction of communication signals sent from the remote control unit to the remote antenna unit. The attenuator may be configurable to provide a desired level of attenuation. For example, if a discrete attenuator is used, the attenuator be configurable between about 0 dB and 20 dB (or more) attenuation (e.g., in steps of about 0.5 dB, etc.). When a configurable attenuator is used, one or both of the amplifiers 112 and 116 may be provided with constant gain, and the total amplification is composed of the constant gain of the amplifier, minus the attenuation provided by the configurable attenuator. In these cases, the attenuators may be controlled by the respective controllers in the remote antenna unit as well as the remote control unit. Such a setup allows the use of amplifiers that are easy to manufacture, and may thus reduce costs of the overall system.

Figure 4:
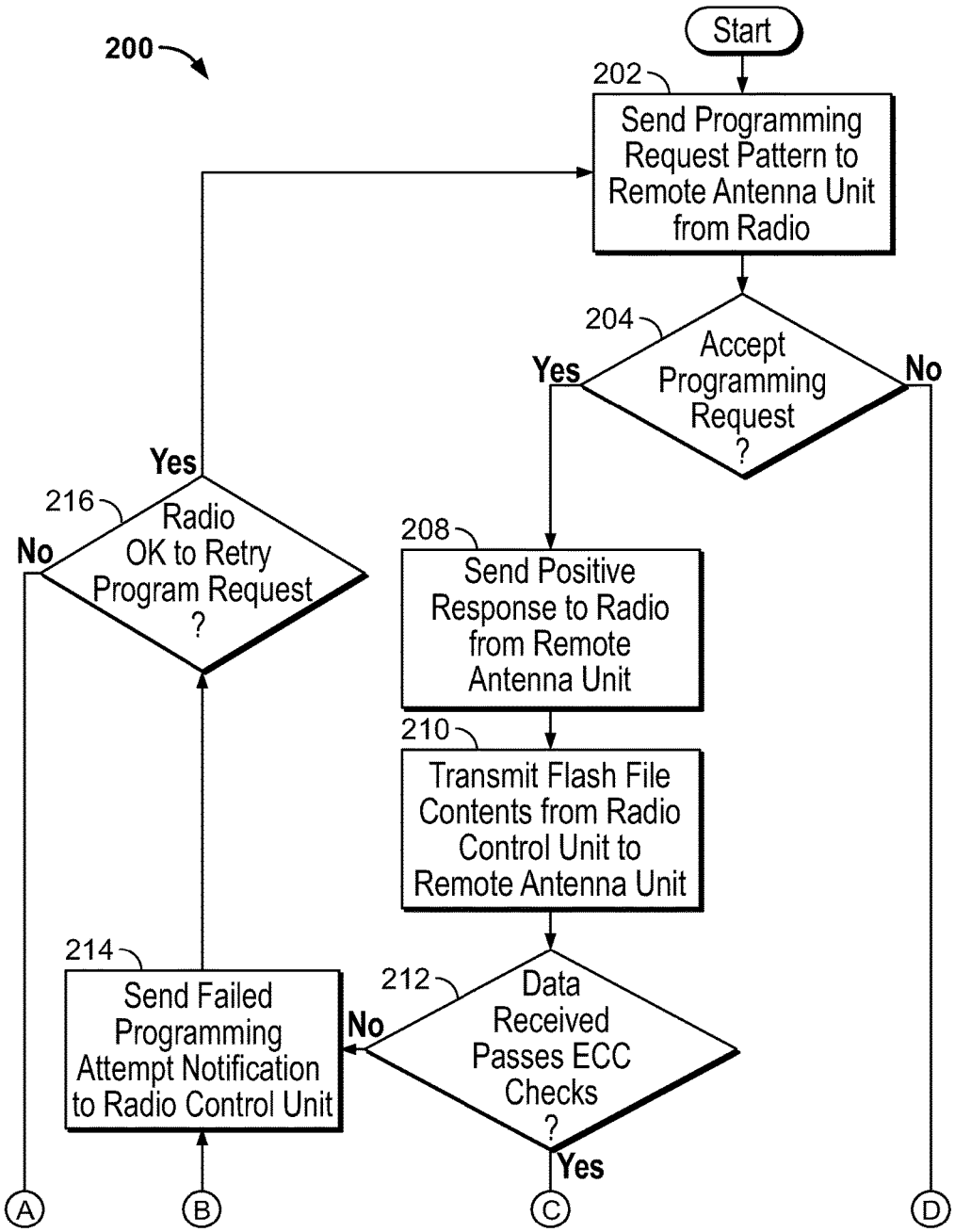
FIG. 4 is a flowchart of an example method for reprogramming a remote antenna unit via a communication cable according to another example embodiment of the present disclosure.
Figure 4:
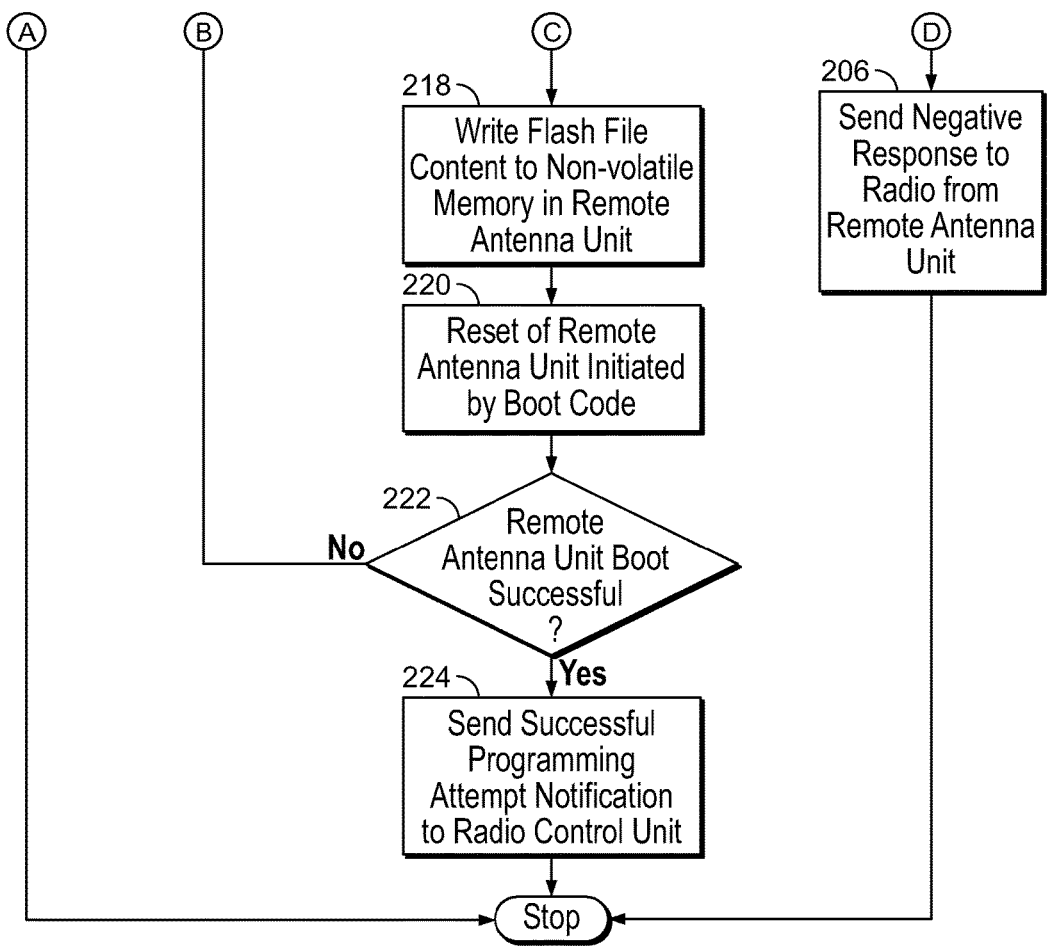

FIG. 4 illustrates a flowchart of an example method 200 for reprogramming a remote antenna unit via a communication cable, according to another example embodiment of the present disclosure. As shown in FIG. 4, the method 200 starts by sending a programming request pattern to the remote antenna unit 104 from the radio control unit 102, at 202. At 204, the method 200 determines whether the programming request is accepted, and if not, sends a negative response to the radio control unit 102 from the remote antenna unit 104, at 206, and the method 200 ends.

If the programming request is accepted, a positive response is sent from the radio control unit to the remote antenna unit 104, at 208. Next, a flash file contents are transmitted from the radio control unit 102 to the remote antenna unit 104, at 210. At 212, it is determined whether the received data passes error-correcting code (ECC) checks.

If the data does not pass the ECC checks, a failed programming attempt notification is sent to the radio control unit 102 at 214, and it is determined whether the radio control unit 102 is OK to retry the program request at 216. If the radio control unit 102 is OK to retry the program request, the programming request is sent again at 202. If the radio control unit 102 is not OK to retry the program request, the method 200 ends.

Referring back to the determination at 212, if the data received passes the ECC checks, the flash file content is written to non-volatile memory in the remote antenna unit 104, at 218. Next, a reset of the remote antenna unit 104 is initiated by boot code at 220. At 222, a determination is made whether the remote antenna unit boot was successful. If not, a failed programming attempt notification is sent to the radio control unit 102, at 214. If the remote antenna unit boot was successful, a successful programming attempt notification is sent to the radio control unit 102, at 224, and the method 200 ends.

As described herein, the example radio control units 102, remote antenna units 104, and controllers 110 and 122 may include one or more microprocessors, microcontrollers, integrated circuits, digital signal processors, etc., which may include memory. The example radio control units 102, remote antenna units 104, and controllers 110 and 122 may be configured to perform (e.g., operable to perform, etc.) any of the example processes described herein using any suitable hardware and/or software implementation. For example, the example radio control units 102, remote antenna units 104, and controllers 110 and 122 may execute computer-executable instructions stored in a memory, may include one or more logic gates, control circuitry, etc.

According to another example embodiment remote antenna unit includes at least one amplifier, a controller, and a cable interface for connecting a cable coupled to a radio control unit. The remote antenna unit is configured to receive radio frequency (RF) communication signals from the radio control through the cable, transmit the received RF communication signals via the at least one antenna, and control a level of amplification of the at least one amplifier to compensate for signal loss in the cable during transmission of the RF communication signals.

The remote antenna unit is also configured to receive flash programming data from the radio control unit through the cable, and reprogram the controller based on the received flash programming data.

According to another example embodiment, an exemplary method of reprogramming a remote antenna unit coupled to a radio control unit via a cable in a vehicle is disclosed. The exemplary method generally includes transmitting radio frequency (RF) communication signals from the radio control unit to the remote antenna unit through the cable for transmission of the RF communication signals by an antenna of the remote antenna unit, and controlling a level of amplification of at least one amplifier of the remote antenna unit to compensate for signal loss in the cable during transmission of the RF communication signals.

The method also includes receiving, at the radio control unit, flash programming data for reprogramming the remote antenna unit, and transmitting the received flash programming data from the radio control unit to the remote antenna unit through the cable to reprogram the controller of the remote antenna unit.

In some embodiments, the method includes reprogramming a controller of the remote antenna unit based on the flash programming data received through the cable, without disassembling the remote antenna unit, and without disassembling a vehicle to which the remote antenna unit is coupled, to connect a programming interface to the remote antenna unit.

Transmitting the received flash programming data may include multiplexing the flash programming data on the cable with the RF communication signals via a predetermined protocol stored in the remote antenna unit. Receiving flash programming data at the radio control unit may include at least one of receiving the flash programming data via a hard-wired connection interface of the radio control unit, and receiving the flash programming data via a wireless over-the-air (OTA) update.

Some embodiments may provide one or more (or none) of the following advantages: reprogramming of a remote antenna unit through a cable that is shared with the RF communication channel, reprogramming of units after vehicle production has been completed through the radio control unit upstream from the remote antenna unit, reducing the risk of obsolescence and the significant labor cost of replacement, etc.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purposes of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A vehicular communication system comprising:
a radio control unit;
a remote antenna unit including at least one amplifier, a controller, and at least one of an antenna and an antenna interface; and
a cable coupled between the radio control unit and the remote antenna unit, wherein:
the radio control unit is configured to transmit radio frequency (RF) communication signals to the remote antenna unit through the cable, and the remote antenna unit is configured to transmit RF communication signals to the radio control unit through the cable;
the remote antenna unit controller is configured to control a level of amplification of the at least one amplifier to compensate at least for signal loss in the cable during transmission of the RF communication signals;
the radio control unit is configured to transmit flash programming data to the remote antenna unit through the same cable as the RF communication signals to reprogram the controller of the remote antenna unit, the remote antenna unit configured to reprogram the controller of the remote antenna unit according to the flash programming data received through the cable without connecting a programming interface to the remote antenna unit by disassembling the remote antenna unit or a vehicle to which the remote antenna unit is coupled; and
the flash programming data is transmitted on the cable with the RF communication signals via a predetermined protocol stored in the remote antenna unit, the predetermined protocol including a specified bit pattern indicative that a subsequent transmitted message comprises the flash programming data.

2. The vehicular communication system of claim 1, wherein the RF communication signals are transmitted at a frequency of 5.9 GHz.

3. The vehicular communication system of claim 1, wherein the remote antenna unit does not include any wiring dedicated to connecting a programming interface to the remote antenna unit in order to reprogram the remote antenna unit.

4. The vehicular communication system of claim 1, wherein:
the remote antenna unit is configured to receive the RF communication signals transmitted by the radio control unit via the cable, amplify the received RF communication signals using at least one amplifier, transmit the amplified RF communication signals using the at least one antenna; and
the remote antenna unit is configured to receive RF communication signals from a remote source via the at least one antenna, amplify the RF communication signals received from the remote source using at least one amplifier, and transmit the amplified RF communication signals received from the remote source to the radio control unit via the cable.

5. The vehicular communication system of claim 1, wherein the remote antenna unit and the radio control unit are separately coupled to a vehicle.

6. The vehicular communication system of claim 1, wherein the predetermined protocol includes transmitting the flash programming data on a dedicated subcarrier frequency on the cable.

7. The vehicular communication system of claim 1, wherein the predetermined protocol includes multiplexing the flash programming data on the cable with the RF communication signals.

8. The vehicular communication system of claim 1, wherein the predetermined protocol is unidirectional such that flash programming data communications pass only from the radio control unit to the remote antenna unit.

9. The vehicular communication system of claim 1, wherein the predetermined protocol is bidirectional such that flash programming data communications are transmitted in both directions between the radio control unit and the remote antenna unit.

10. The vehicular communication system of claim 1, wherein the remote antenna unit is configured to, in response to receiving an initialization command of the predetermined protocol, enter a self-programming mode and overwrite a program file of the remote antenna unit controller using the flash programming data transmitted by the radio control unit through the cable.

11. The vehicular communication system of claim 1, wherein the radio control unit includes at least one of:
a hard-wired connection interface to receive the flash programming data from an on-board diagnostics port of a vehicle to which the radio control unit is coupled; and
a wireless interface to receive the flash programming data via a wireless over-the-air (OTA) update.

12. The vehicular communication system of claim 1, wherein the remote antenna unit includes an antenna.

13. A method of reprogramming a remote antenna unit coupled to a radio control unit via a cable in a vehicle, the method comprising:
transmitting radio frequency (RF) communication signals from the radio control unit to the remote antenna unit through the cable for transmission of the RF communication signals by an antenna of the remote antenna unit;
controlling a level of amplification of at least one amplifier of the remote antenna unit to compensate at least for signal loss in the cable during transmission of the RF communication signals;
receiving, at the radio control unit, flash programming data for reprogramming the remote antenna unit; and
transmitting the received flash programming data from the radio control unit to the remote antenna unit through the same cable as the RF communication signals to reprogram the controller of the remote antenna unit according to the flash programming data received through the cable, without connecting a programming interface to the remote antenna unit by disassembling the remote antenna unit or a vehicle to which the remote antenna unit is coupled;
wherein transmitting the flash programming data includes transmitting the flash programming data on the cable with the RF communication signals via a predetermined protocol stored in the remote antenna unit; and wherein the predetermined protocol includes a specified bit pattern indicative that a subsequent transmitted message comprises the flash programming data.

14. The method of claim 13, wherein receiving flash programming data at the radio control unit includes as least one of:
receiving the flash programming data via a hard-wired connection interface of the radio control unit; and
receiving the flash programming data via a wireless over-the-air (OTA) update.

15. A remote antenna unit comprising:
at least one amplifier;
a controller;
a cable interface for connecting a cable coupled to a radio control unit; and
at least one of an antenna and an antenna interface, the remote antenna unit configured to:
receive radio frequency (RF) communication signals from the radio control through the cable;
transmit the received RF communication signals via the at least one antenna;
control a level of amplification of the at least one amplifier to compensate for at least signal loss in the cable during transmission of the RF communication signals;
receive flash programming data from the radio control unit through the same cable as the RF communication signals; and
reprogram the controller based on the received flash programming data according to the flash programming data received through the cable, without connecting a programming interface to the remote antenna unit by disassembling the remote antenna unit or a vehicle to which the remote antenna unit is coupled;
wherein the remote antenna unit is configured to receive the flash programming data on the cable with the RF communication signals via a predetermined protocol stored in the remote antenna unit; and
wherein the predetermined protocol includes a specified bit pattern indicative that a subsequent transmitted message comprises the flash programming data.

* * * * *